US008775996B2

(12) United States Patent
Alpert et al.

(10) Patent No.: US 8,775,996 B2
(45) Date of Patent: Jul. 8, 2014

(54) DIRECT CURRENT CIRCUIT ANALYSIS BASED CLOCK NETWORK DESIGN

(71) Applicant: International Business Machines Corporation, Armonk, NY (US)

(72) Inventors: Charles Jay Alpert, Austin, TX (US); Joseph Nicolas Kozhaya, Morrisville, NC (US); Zhuo Li, Cedar Park, TX (US); Joseph J. Palumbo, Poughkeepsie, NY (US); Haifeng Qian, White Plains, NY (US); Phillip John Restle, Katonah, NY (US); Chin Ngai Sze, Austin, TX (US); Ying Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/680,775

(22) Filed: Nov. 19, 2012

(65) Prior Publication Data

US 2014/0143746 A1     May 22, 2014

(51) Int. Cl.
 *G06F 17/50* (2006.01)
(52) U.S. Cl.
 USPC ........... 716/114; 716/106; 716/108; 716/111; 716/113; 716/134
(58) Field of Classification Search
 USPC .................................. 716/106–115, 132–135
 See application file for complete search history.

(56) References Cited

U.S. PATENT DOCUMENTS

| | | | |
|---|---|---|---|
| 5,339,253 A | 8/1994 | Carrig et al. | |
| 5,963,728 A | 10/1999 | Hathaway et al. | |
| 6,006,025 A | 12/1999 | Cook et al. | |
| 6,204,713 B1 | 3/2001 | Adams et al. | |
| 6,205,571 B1 | 3/2001 | Camporese et al. | |
| 6,311,313 B1 | 10/2001 | Camporese et al. | |
| 6,351,840 B1 | 2/2002 | Teng | |
| 6,487,697 B1 | 11/2002 | Lu et al. | |
| 6,591,411 B2 | 7/2003 | Alpert et al. | |
| 6,601,025 B1 | 7/2003 | Moore et al. | |
| 6,651,232 B1 | 11/2003 | Pileggi et al. | |
| 6,698,006 B1 | 2/2004 | Srinivasan et al. | |
| 6,769,104 B2 | 7/2004 | Rodgers et al. | |

(Continued)

OTHER PUBLICATIONS

Berridge, R et al., "IBM POWER6 microprocessor physical design and design methodology", IBM J. Res. & Dev. vol. 51 No. 6 Nov. 2007, pp. 685-714.

(Continued)

*Primary Examiner* — Nha Nguyen
(74) *Attorney, Agent, or Firm* — DeLizio Gilliam, PLLC

(57) ABSTRACT

A design tool with a direct current (DC) transformation analysis unit determines combinations of candidate sink locations for sector buffers within a sector of a clock network design. For each of the combination of candidate sink locations, the design tool transforms resistances of the sector with the combination of candidate sink locations into resistances of an electrical circuit. The design tool transforms capacitances of the sector with the combination of candidate sink locations into current sources of an electrical circuit. The design tool performs a DC circuit analysis, wherein results of the DC circuit analysis include a variance of voltage at nodes of the sector and a maximum value of current from currents flowing between pairs of the nodes of the sector. The design tool determines which of the combination of candidate sink locations has the minimum variance of voltage with the results of the DC circuit analysis.

20 Claims, 4 Drawing Sheets

(56) References Cited

U.S. PATENT DOCUMENTS

| | | |
|---|---|---|
| 7,296,252 B2 | 11/2007 | Alpert et al. |
| 7,308,669 B2 | 12/2007 | Buehler et al. |
| 7,404,169 B2 | 7/2008 | Lim et al. |
| 7,484,199 B2 | 1/2009 | Alpert et al. |
| 7,549,137 B2 | 6/2009 | Alpert et al. |
| 7,571,410 B2 | 8/2009 | Restle |
| 7,624,366 B2 | 11/2009 | Alpert et al. |
| 7,788,613 B2 | 8/2010 | Walker et al. |
| 8,006,213 B2 | 8/2011 | Berry et al. |
| 8,015,527 B2 | 9/2011 | Buehler et al. |
| 8,104,014 B2 | 1/2012 | Puri et al. |
| 8,572,542 B2 | 10/2013 | Shih et al. |
| 2003/0135836 A1 | 7/2003 | Chang et al. |
| 2007/0204255 A1 | 8/2007 | Narasimhan |
| 2007/0288875 A1* | 12/2007 | Eakins et al. ............. 716/6 |
| 2008/0059933 A1 | 3/2008 | Barke et al. |
| 2008/0229266 A1 | 9/2008 | Bueti et al. |
| 2009/0237134 A1 | 9/2009 | Hwang et al. |
| 2010/0100347 A1 | 4/2010 | Buehler et al. |
| 2012/0011485 A1 | 1/2012 | Suaya et al. |
| 2012/0047478 A1 | 2/2012 | Ge et al. |
| 2012/0221996 A1* | 8/2012 | Thayer ..................... 716/134 |
| 2012/0240091 A1* | 9/2012 | Sunder et al. ............. 716/113 |
| 2013/0174104 A1 | 7/2013 | Vishweshwara et al. |
| 2013/0326456 A1 | 12/2013 | Alpert et al. |

OTHER PUBLICATIONS

Ganguly, Shantanu et al., "Clock Distribution Methodology for PowerPC Microprocessors", Journal of VLSI Signal Processing 16, 181-189 (1997) 1997, pp. 69-77.

Hu, Xuchu et al., "Distributed LC Resonant Clock Grid Synthesis", IEEE Transactions on Circuits and Systems—I: Regular Papers 2012, pp. 1-12.

Qian, Haifeng et al., "Power Grid Analysis Using Random Walks", IEEE Transactions on Computer-Aided Design of Integrated Circuits and Systems, vol. 24, No. 8 Aug. 2005, 21 pages.

Vishweshwara, R et al., "Placement Aware Clock Gate Cloning and Redistribution Methodology", 13th Int'l Symposium on Quality Electronic Design, IEEE 2012, 5 pages.

Warnock, J D et al., "The circuit and physical design of the POWER4 microprocessor", IBM J. Res. & Dev. vol. 46 No. 1 Jan. 2002, pp. 27-51.

"U.S. Appl. No. 13/488,065 Office Action", Apr. 26, 2013, 17 pages.
U.S. Appl. No. 13/724,212 Office Action, Nov. 8, 2013, 13 pages.

* cited by examiner

DIRECT CURRENT CIRCUIT ANALYSIS BASED CLOCK NETWORK DESIGN

BACKGROUND

Embodiments of the inventive subject matter generally relate to the field of computers, and, more particularly, to a direct current circuit analysis based clock network design.

High-performance very large scale integration (VLSI) chips have an internal clock signal that is a function of an external clock signal. The internal clock signal (hereinafter "clock signal") is distributed to a large number of clock pins. The clock pins are specific locations or metal shapes on a VLSI chip (hereinafter "chip") which have a known or estimated effective pin capacitance. The frequency of the clock signal determines the frequency and cycle time of the chip. Shorter cycle times and higher chip frequencies are desirable for improving the chip performance. Clock skew is the difference in arrival time of the clock signal at different locations in the chip. Clock skew can limit achievable cycle time and reduce chip performance. Clock slew is the rate of change of the clock signal voltage.

Clock buffers (hereinafter "sector buffers") drive the clock signal in a sector (i.e., a section) of the clock distribution network. The sector buffers help in reducing clock skew and improve the chip performance. The output terminal of a sector buffer may be connected at one or more of the multiple locations in the sector. The locations at which the output terminals of the sector buffers are connected, are referred to as sink locations.

SUMMARY

Embodiments of the inventive subject matter include a method that determines, within a sector in a clock network design for a microprocessor, combinations of candidate sink locations for sector buffers, wherein the candidate sink locations comprise candidate connection points for connecting output terminals of the sector buffers to wire structures of the sector. For each of the combination of candidate sink locations, the method transforms resistances of the sector with the combination of candidate sink locations into resistances of an electrical circuit. The method transforms capacitances of the sector with the combination of candidate sink locations into current sources of an electrical circuit. The method performs a direct current circuit analysis based, at least partly, on the resistances and the current sources, wherein results of the direct current circuit analysis include a variance of voltage at nodes of the sector and a maximum value of current from currents flowing between pairs of the nodes of the sector. The method stores the results of the direct current circuit analysis for the combinations of candidate sink locations. The method determines which of the combination of candidate sink locations has the minimum variance of voltage with the results of the direct current circuit analysis. The method selects the combination of candidate sink locations that has the minimum variance of voltage as connection points for the output terminals of the sector buffers.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary systems, methods, techniques, instruction sequences and computer program products that embody techniques of the present inventive subject matter. However, it is understood that the described embodiments may be practiced without these specific details. For instance, examples refer to a direct current (DC) transformation analysis unit transforming a sector into an electrical circuit and performing DC circuit analysis. However, embodiments are not limited to the DC transformation analysis unit transforming the sector into the electrical circuit and performing DC circuit analysis. DC circuit analysis may be performed by other units embodied in a circuit design tool or the system memory. In other instances, well-known instruction instances, protocols, structures and techniques have not been shown in detail in order not to obfuscate the description.

A clock distribution network can be designed in accordance with any one of a variety of clock architectures. Example clock architectures include a clock tree, clock mesh, a hybrid of a clock tree and cross-links, and a hybrid of a clock mesh and local clock trees. A DC transformation analysis unit transforms a sector of a clock distribution network into a DC circuit and analyzes a variance of voltage in the DC circuit. For example, the DC transformation analysis unit transforms connections (or edges) and loads in the sector to resistances and capacitances, respectively. Transforming the sector into the DC circuit allows a design tool to design the clock distribution network with reduced clock skew and a reduced difference between the minimum and maximum slew rate for clock signals. The sector buffers driving the clock signals typically have a high fan-out. In addition, a clock distribution network commonly has unevenly distributed loads (e.g., capacitive loads representing the input capacitances of the circuits receiving the clock signal) in contrast to an assumption of evenly distributed loads by conventional tools. Further, a number of loads are often locally wired together by a clock grid, or one or more clock spines, or other local wiring structures. These local wiring structures are connected to the output terminals of sector buffers at certain sink locations chosen to reduce the clock skew and improve the clock slew. Also, when one or more sink locations for a sector buffer are chosen such that delays on the paths to the loads to be driven are balanced, the chip performance can be further improved.

Figure 1:
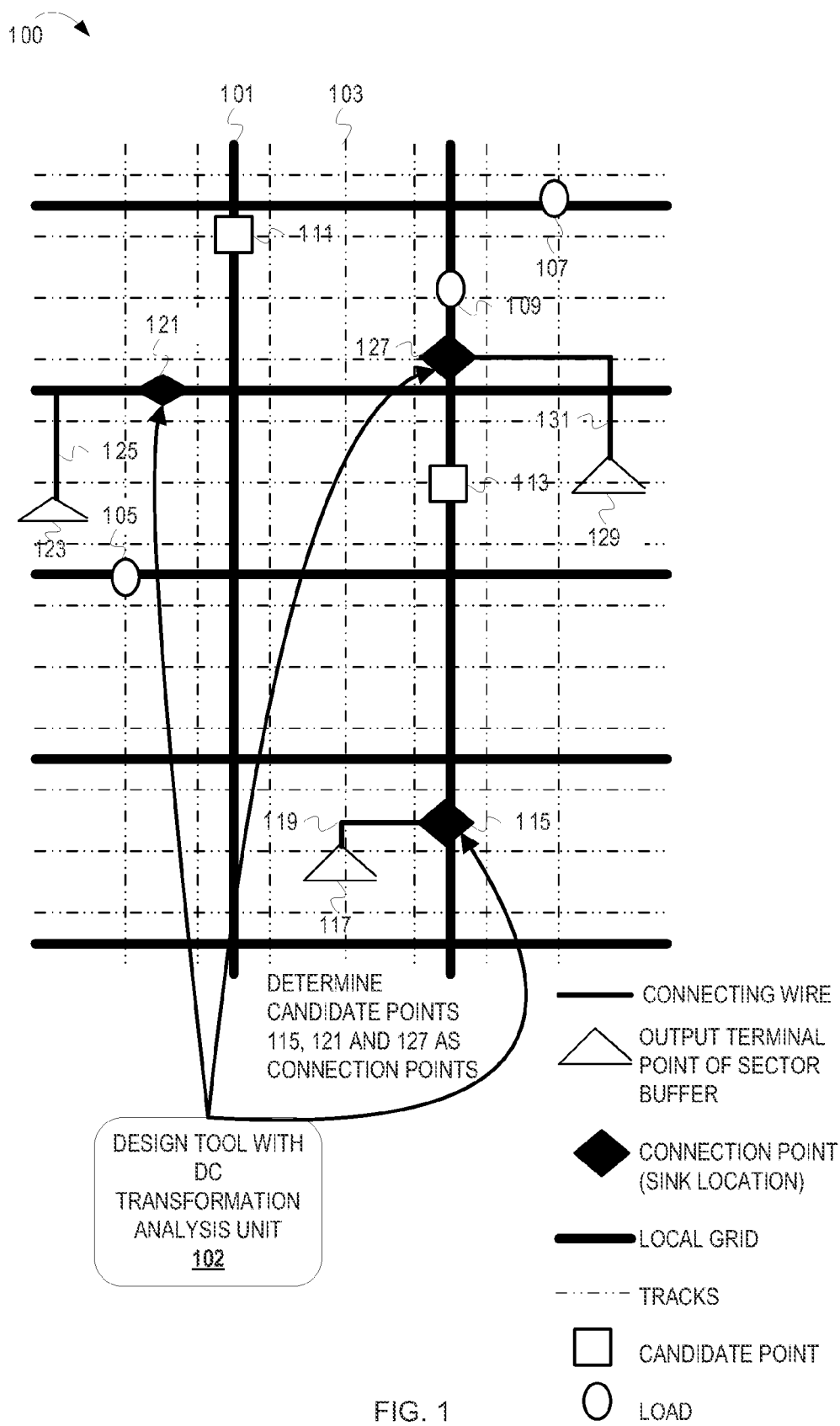
FIG. 1 depicts an example conceptual diagram of a design tool with a DC transformation analysis unit determining connection points for output terminals of sector buffers in a sector.

FIG. 1 depicts an example conceptual diagram of a design tool with a DC transformation analysis unit determining connection points for output terminals of sector buffers in a sector. FIG. 1 depicts a sector 100 and a design tool 102 with a DC transformation analysis unit. The sector 100 is one of multiple sectors in a clock distribution network of a chip. The clock distribution network is efficiently tuned from a geographic perspective of the clock distribution network as represented by the sectors. A design tool tunes a clock distribution network to achieve desired clock skew and clock slew.

Sector buffers drive clock signals in a sector to loads in the sector. The sector buffers may not be located close to the sector, however the output terminals of the sector buffers are connected to sink locations in the sector in order to drive the clock signals. The sector 100 includes a local grid 101 (represented by the thickest gridlines) and available tracks 103 (represented by the dashed gridlines). The local grid 101 may alternatively consist of vertical or horizontal clock spines, any other wiring structure or structures that collectively connect the loads in the sector 100. The clock signals are transmitted over the local grid 101. Signals driven to the chip are transmitted using the tracks 103. The local grid 101 includes loads 105, 107 and 109. The loads on the local grid 101 are typically capacitive loads due to high fan-out of logic gates. Candidate points 111 and 113 represent locations in the sector 100 which lie at intersections of the local grid 101 and the tracks 103. The candidate points 111 and 113 represent the locations where output terminals 117, 123 and 129 of three sector buffers in the sector 100 can be connected. For simplification, all candidate points are not depicted in the sector 100. The sector 100 also includes points 115, 121 and 127 that start as a set of candidate points and are eventually chosen as connection points. The connection point 115 is connected to the output terminal 117 of a first sector buffer via a connecting wire 119. The connection point 121 is connected to the output terminal 123 of a second sector buffer via a connecting wire 125. The connection point 127 is connected to the output terminal 129 of a third sector buffer via a connecting wire 131. The connection points 115, 121 and 127 are also referred to as the sink locations for the respective sector buffers.

The design tool 102 selects the points 115, 121 and 127 to be the connection points for connecting the output terminals 117, 123 and 129 of the respective sector buffers. For simplification, FIG. 1 only depicts sink locations for three sector buffers. However, the design tool 102 typically determines sink locations for each of the sector buffers in the sector 100. In certain existing techniques, the sink locations for the sector buffers are determined as the geometrically symmetric points in the sector 100, based on an assumption of symmetric distribution of the loads 105, 107 and 109 in the sector 100. However, the loads 105, 107 and 109 are typically not uniformly distributed. A clock distribution network design with an assumption that the loads 105, 107 and 109 are uniformly distributed results in higher clock skew and large variations in clock slew. Also, clock slew impacts the power of clock signal to be utilized. A reduction in the difference between the maximum and minimum clock slew allows a designer to increase the mean clock slew which reduces the power of the clock signal to be utilized. For example, a reduction by 1 picosecond in difference between the maximum and minimum clock slew may allow an increase in mean clock slew by 0.5 picosecond. The increase in mean clock slew by 0.5 picosecond can result in reduction of the clock signal power requirements by approximately 1.5%. The design tool 102 with DC transformation analysis unit balances the magnitude of loads to be driven via each sink location.

At first, the design tool 102 determines the total load (i.e., sum of magnitude of loads 105, 107 and 109) to be driven in the sector 100. Based on the capabilities of sector buffers (e.g., the magnitude of load a sector buffer can drive), the design tool 102 determines the number of sector buffers to drive the total load. In the sector 100, the design tool 102 determines that three sector buffers can drive the total load in the sector 100. The design tool 102 then determines different combinations of candidate sink locations for the sector buffers. For example, a combination of candidate sink locations is a set of three candidate points (e.g., (115, 121, 127), (115, 111, 113), (111, 113, 121), etc.) in the sector 100. With a few sector buffers, the number of combinations of candidate sink locations can be in the range of thousands to millions (taking into account different combinations of connecting output terminals of sector buffers at all available candidate points). However, the design tool 102 does not necessarily utilize all combinations of candidate sink locations in determining the connection points of sector buffers. For example, the design tool 102 does not utilize the combinations of candidate sink locations that are geometrically concentrated in the sector 100 (e.g., (111, 113, 127), etc.). In some embodiments, the design tool 102 utilizes certain combinations of candidate sink locations to determine the connection points for output terminals of the three sector buffers in the sector 100. The design tool 102 performs DC circuit analysis (as described below with reference to FIG. 3) for the sector 100 corresponding to a combination of sink locations. The design tool 102 repeats DC circuit analysis multiple times for different combinations of the candidate sink locations. During DC circuit analysis, for each combination of candidate sink locations, the design tool 102 determines voltages at nodes (e.g., loads, connection points, etc.) in the respective electrical circuit.

The design tool 102 then determines the combination of candidate sink locations having the minimum variance (or a minimum first moment) of voltage at the nodes in the respective electrical circuit, as the combination of sink locations for the sector buffers.

Figure 2:
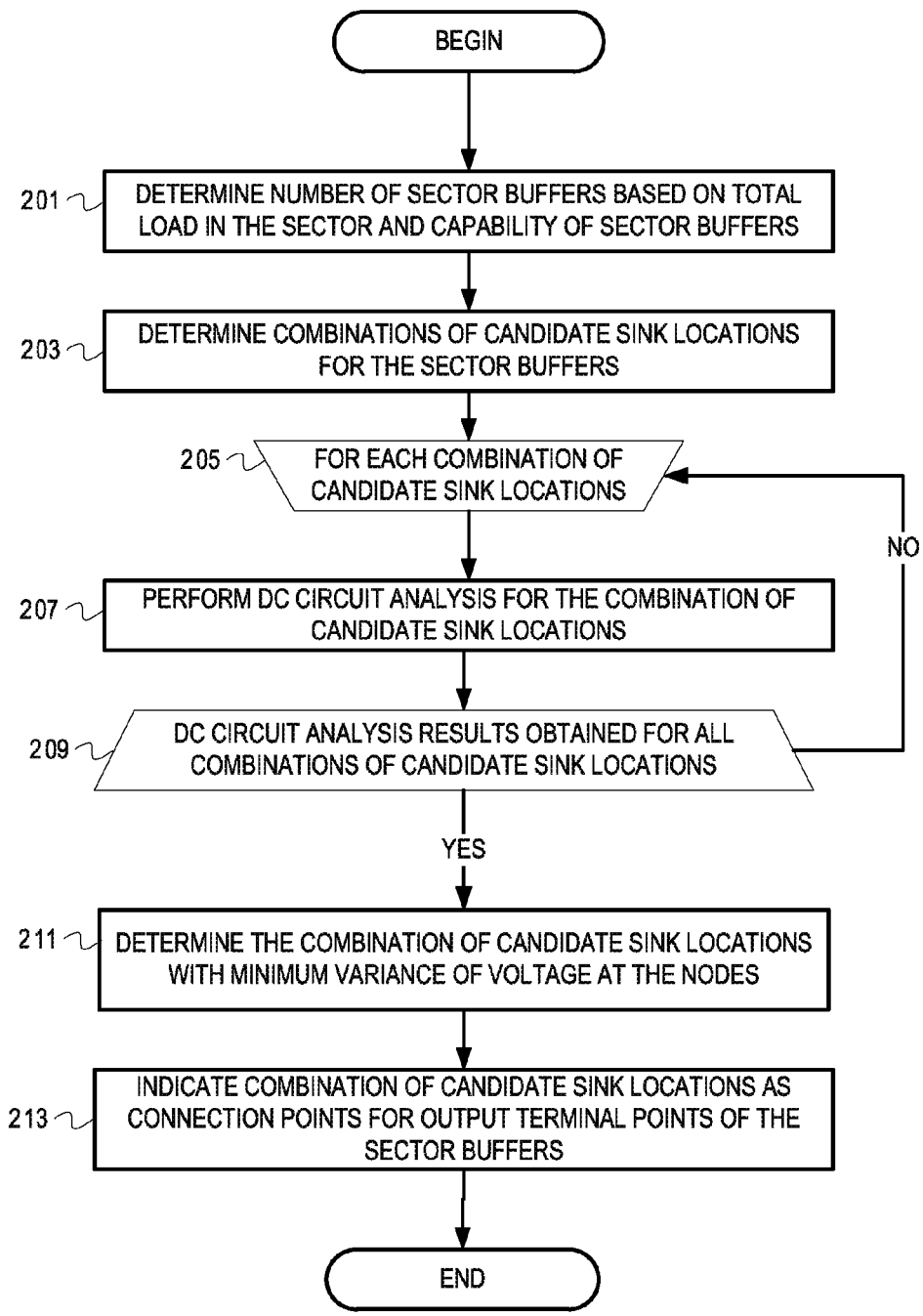
FIG. 2 illustrates a flow diagram of example operations to determine connection points for output terminals of sector buffers in a sector based on DC circuit analysis.

FIG. 2 illustrates a flow diagram of example operations to determine connection points for output terminals of sector buffers in a sector based on DC circuit analysis.

At block 201, a number of sector buffers is determined based on the total load in the sector and capability of the sector buffers. For example, a design tool determines the number of sector buffers based on the total load to be driven in the sector and the magnitude of load a sector buffer can drive.

At block 203, combinations of candidate sink locations are determined for the sector buffers. For example, the design tool determines the combinations of candidate sink locations for the sector buffers based on the number of sector buffers (determined at block 201), and available candidate points (for connecting the output terminals of sector buffers) in the sector. The design tool also determines certain combinations of candidate sink locations to be utilized for determining the connection points for connecting output terminals of the sector buffers based on distribution of the candidate sink locations in the sector. For example, the design tool determines that certain combinations of candidate sink locations have a better (i.e., more even) distribution of the candidate sink locations in the sector. The design tool utilizes the combinations of candidate sink locations, which have a better distribution of the candidate sink locations in the sector, in the operations at blocks 205-207.

At block 205, a loop is started for each of the combinations of candidate sink locations for the sector buffers. For example, the design tool starts a loop for each combination of candidate sink locations (determined at block 203). The loop includes operations at blocks 207 and 209.

At block 207, DC circuit analysis is performed for the combination of candidate sink locations. The operations for performing DC circuit analysis at block 207 are illustrated in the flow diagram of FIG. 3. Each combination of sink locations is considered a different hypothetical circuit. The candidate sink locations are included in the DC circuit analysis as nodes in the hypothetical circuit. The results of DC circuit analysis include a variance of voltage at nodes and a maximum value of current for the respective combination of candidate sink locations.

At block 209, it is determined whether DC circuit analysis results are obtained for all combinations of the candidate sink locations. If DC circuit analysis results have been obtained for all the combinations of the candidate sink locations, control flows to block 211. If DC circuit analysis results have not been obtained for all the combinations of the candidate sink locations, control loops back to block 205.

At block 211, a combination of candidate sink locations with minimum variance of voltage at nodes is determined. For example, the design tool determines the combination of candidate sink locations having a minimum value of the variance of voltage from multiple values (of the variance of voltage) stored in a memory. Each of the multiple values stored in the memory corresponds to the variance of voltage for a specific combination of candidate sink locations. In some embodiments, the design tool determines the combination of candidate sink locations based on the minimum value of the current from multiple values (of the maximum current for each of the combinations of candidate sink locations) stored in the memory.

At block 213, the combination of candidate sink locations determined at block 211 are indicated as connection points (i.e., sink locations) for the output terminals of the sector buffers in the sector. For example, the design tool marks the combination of candidate sink locations determined at block 211 as connection points for the output terminals of the sector buffers. In some embodiments, the design tool connects the output terminals of the sector buffers to the respective sink locations.

Figure 3:
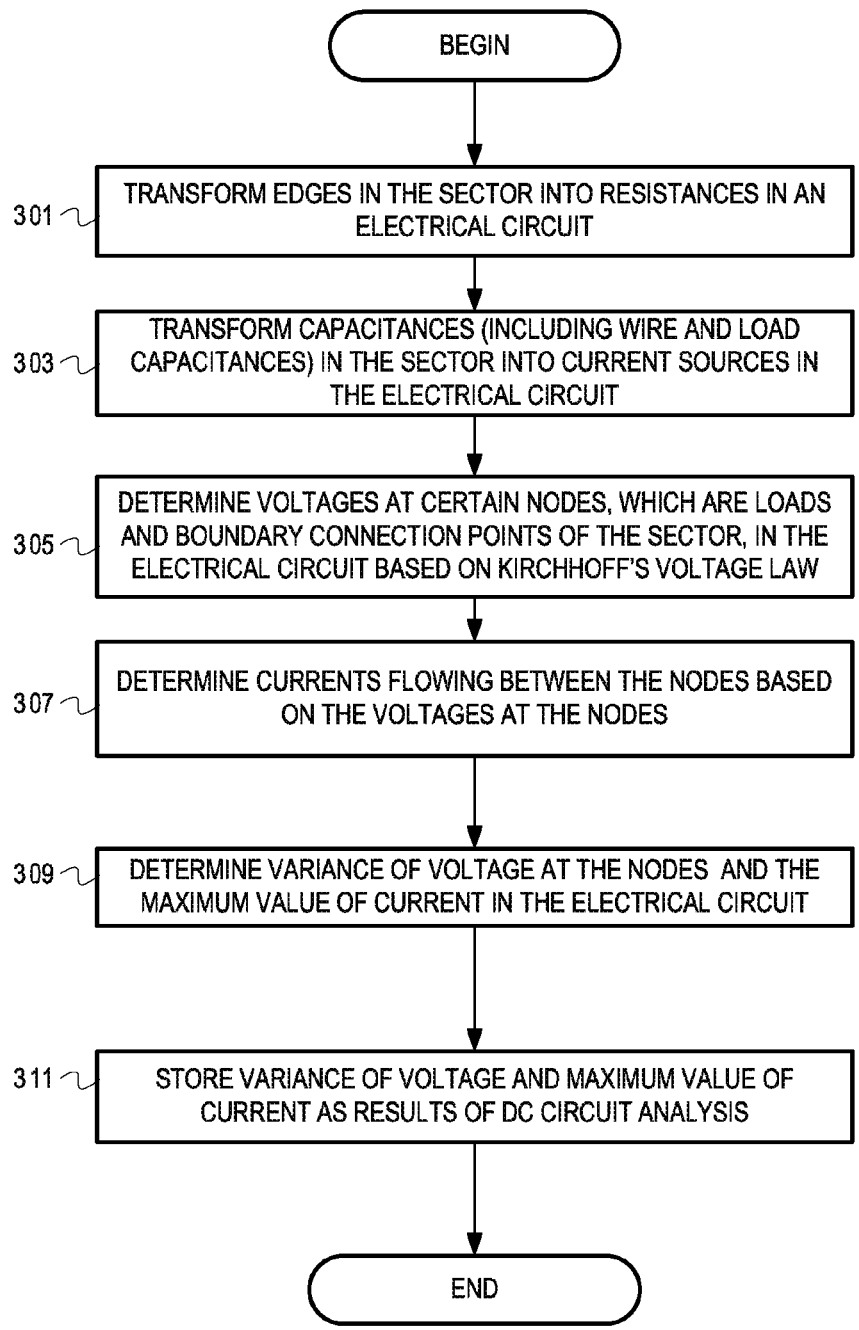
FIG. 3 illustrates a flow diagram of example operations to perform direct current circuit analysis in a sector for a set of candidate sink locations.

FIG. 3 illustrates a flow diagram of example operations to perform a direct current circuit analysis in a sector for a combination of candidate sink locations. The operations in the flow diagram of FIG. 3 illustrate operations at block 207, as described above with reference to FIG. 2.

At block 301, edges (or grid lines) in a sector of a clock distribution network are transformed into resistances in an electrical circuit. For example, a design tool transforms the sector into an electrical circuit with the edges (i.e., wires, etc.) in the sector as the resistances. The values for resistances of the edges are determined based on the resistance per unit length and the length of the respective wire.

At block 303, capacitances (including wire and load capacitances) in the sector are transformed into current sources in the electrical circuit. For example, the design tool transforms the wire and load capacitances into current sources based on the value of the respective wire and load capacitances. The design tool can determine the value of wire capacitances based on the value of capacitance per unit length and the length of the respective wire. On transforming the sector into the electrical circuit by operations at blocks 301 and 303, the electrical circuit resembles a pi model. The currents through each of the resistances and the voltages at each of the nodes in the electrical circuit can be solved using Kirchhoff's Voltage Law and the calculations can be further simplified using a matrix (e.g., $[G][V]=[I]$, where $[G]$ is a conductance matrix, $[V]$ is a voltage matrix, and $[I]$ is a current matrix which are of the order of n×n (G is n×n, V is n×1 and I is n×1), where n is the number of nodes in the electrical circuit) to solve for the voltage and current values in the electrical circuit. For example, an entry in $[G]$ corresponds to an inverse of effective resistance between two nodes, an entry in $[V]$ corresponds to voltage (at a given node), and an entry in $[I]$ corresponds to current flow between the two nodes. Also, since each node in the electrical circuit is not connected to every other node in the electrical circuit, many entries in $[G]$ are zero, and hence $[G]$ is a sparse matrix.

At block 305, voltages at certain nodes which are loads and boundary connection points of the sector, in the electrical circuit are determined based on Kirchhoff's Voltage Law. For example, voltages at these nodes which would be expected to have greater variations in voltage values are determined. Since, loads in the sector have higher capacitances, and boundary nodes in the sector are typically connected to a fewer number of neighboring nodes, such nodes are expected to have greater variations in voltages. Voltages can be computed speedily, since the voltages are not necessarily computed at all nodes in the electrical circuit. A design tool can determine voltages at the nodes by computing the entries in $[V]$ (as described above). Some embodiments the design tool can utilize techniques such as random walk to speedily compute the entries in $[V]$ since the voltages for a node with respect to its neighboring nodes is 0.

At block 307, currents flowing between nodes are determined based on the voltages at the nodes. For example, currents flowing through the wires connecting the nodes (i.e., the nodes for which voltages were computed at block 305) are determined using the voltage difference between the nodes based on Ohm's Law. The current flowing between a pair of nodes is directly proportional to the difference in voltages between the nodes, and hence the current flow in the electrical circuit also represents variance in voltages in the electrical circuit.

At block 309, a variance of voltage at the nodes and a maximum value of current in the electrical circuit are determined. For example, the first moment of the voltage values (computed at block 305) is determined as the variance of voltage at the nodes in the electrical circuit. The maximum value of current flowing between any pair of nodes in the electrical circuit (based on the currents determined at block 307) is also determined.

At block 311, the variance of voltage and the maximum value of current are stored as results of DC circuit analysis. For example, the values of the variance of voltage and the maximum current are stored at a memory location corresponding to the respective combination of candidate sink locations.

Those of ordinary skill in the art should understand that the depicted flow diagram includes examples to aid in understanding the inventive subject matter, and should not be used to limit the scope of the claims. The flow diagram in FIG. 3 illustrates performing DC circuit analysis for a combination of candidate sink locations.

However, embodiments can perform DC circuit analysis for multiple combinations of the candidate sink locations in parallel. Embodiments can perform additional operations not depicted, fewer than the depicted operations, the operations in a different order, the operations in parallel, etc. For example, the operations at blocks 305 and 307 are not necessarily performed in the depicted sequence. The current flowing between a pair of nodes may be determined as soon as the voltages at the pair of nodes have been determined, instead of the current being determined after voltages at all nodes have been determined.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
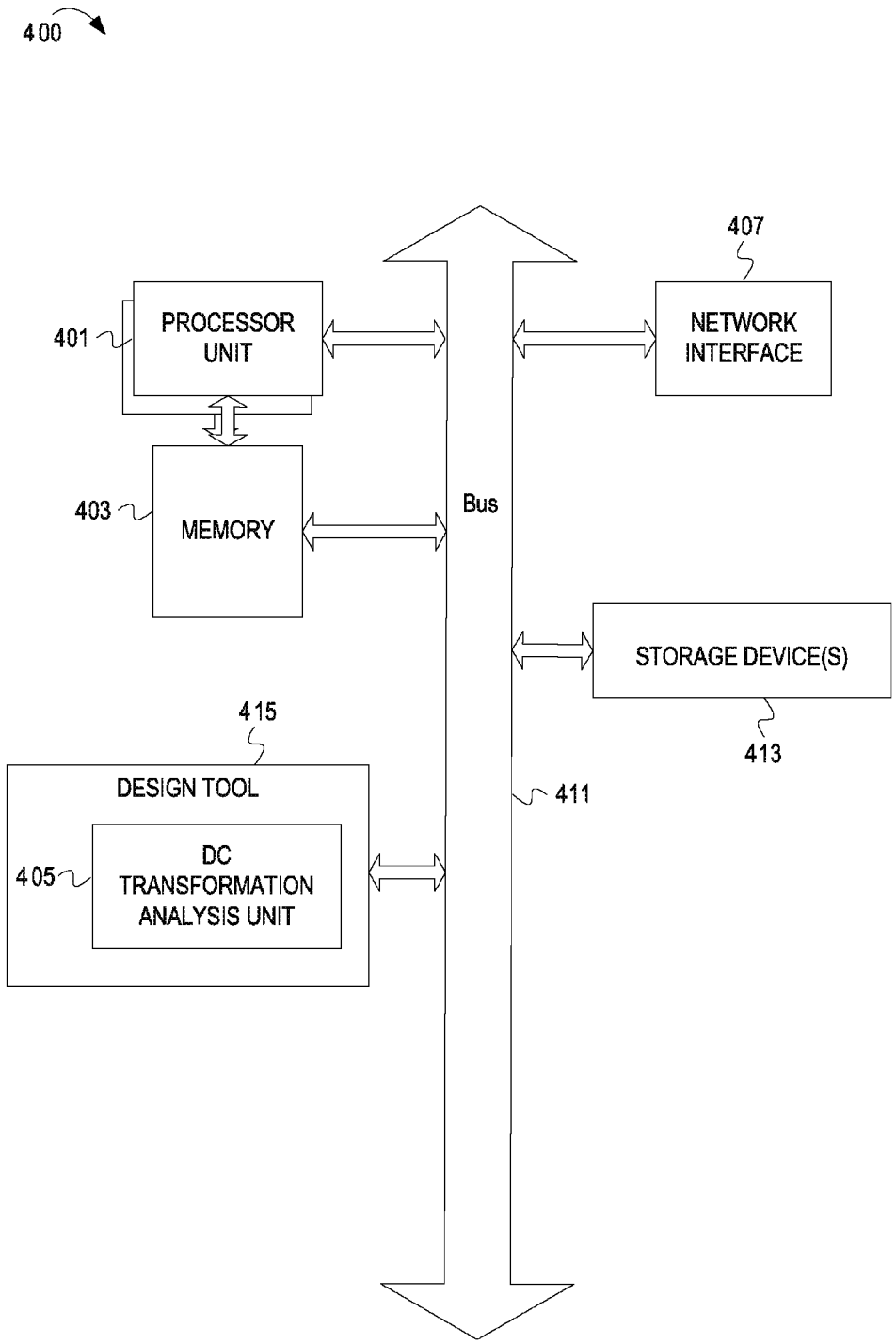
FIG. 4 depicts an example computer system.

FIG. 4 depicts an example computer system with a DC transformation analysis unit. FIG. 4 depicts a computer system 400. The computer system 400 includes a processor unit 401 (possibly including multiple processors, multiple cores, multiple nodes, and/or implementing multi-threading, etc.). The computer system includes memory 403. The memory 403 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 411 (e.g., PCI, ISA, PCI-Express, HyperTransport®, Infini-Band®, NuBus, etc.), a network interface 407 (e.g., an ATM interface, an Ethernet interface, a Frame Relay interface, SONET interface, wireless interface, etc.), a storage device(s) 413 (e.g., optical storage, magnetic storage, etc.) and a DC transformation analysis unit 405 embodied in a design tool 415. The DC transformation analysis unit 405 embodies functionality to aid the design tool 415 in determining sink locations for sector buffers in a sector of a clock distribution network based on DC circuit analysis. The DC transformation analysis unit 405 transforms the sector into an electrical circuit based on a combination of candidate sink locations. The DC transformation analysis unit 405 then determines voltages at certain nodes and the currents flowing between the nodes in the electrical circuit. The DC transformation analysis unit 405 also determines the variance of voltage at nodes in the electrical circuit and the maximum current flowing between a pair of nodes in the electrical circuit. The DC transformation analysis unit 405 stores (in the memory 403) the values of the variance of voltage and the maximum current flowing between the pair of nodes as results of DC circuit analysis for the combination of candidate sink locations. The design tool 415 can then utilize the results of DC circuit analysis obtained for multiple combinations of candidate sink locations to determine the sink locations for sector buffers in the sector. Any one of these functionalities may be partially (or entirely) implemented in hardware and/or on the processing unit 401. For example, the functionality may be implemented with an application specific integrated circuit, in logic implemented in the processing unit 401, in a co-processor on a peripheral device or card, etc. The design tool 415 may be an independent unit as depicted or a component of a circuit design program. The design tool 415 may be program code embodied in the memory 403. Further, realizations may include fewer or additional components not illustrated in FIG. 4 (e.g., video cards, audio cards, additional network interfaces, peripheral devices, etc.). The processor unit 401, the storage device(s) 413, the network interface 407 and the DC transformation analysis unit 405 are coupled to the bus 411. Although illustrated as being coupled to the bus 411, the memory 403 may be coupled to the processor unit 401.

While the embodiments are described with reference to various implementations and exploitations, it will be understood that these embodiments are illustrative and that the scope of the inventive subject matter is not limited to them. In general, techniques for determining sink locations for sector buffers in a sector based on a direct current circuit analysis, as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method comprising:
   determining, within a sector in a clock network design for a microprocessor, combinations of candidate sink locations for sector buffers, wherein the candidate sink locations comprise candidate connection points for connecting output terminals of the sector buffers to wire structures of the sector;
   for each of the combinations of candidate sink locations,
      transforming resistances of the sector with the combination of candidate sink locations into resistances of an electrical circuit;
      transforming capacitances of the sector with the combination of candidate sink locations into current sources of an electrical circuit;
      performing a direct current circuit analysis based, at least partly, on the resistances and the current sources, wherein results of the direct current circuit analysis include a variance of voltage at nodes of the sector and a maximum value of current from currents flowing between pairs of the nodes of the sector;
   storing, by a computer, the results of the direct current circuit analysis for the combinations of candidate sink locations;
   determining, with the results of the direct current circuit analysis, which of the combination of candidate sink locations has at least one of the minimum variance of voltage and the minimum of the maximum values of currents; and
   selecting, as connection points for the output terminals of the sector buffers, the combination of candidate sink locations that has at least one of the minimum variance of voltage and the minimum of the maximum values of currents.

2. The method of claim 1,
   wherein said transforming resistances of the sector with the combination of candidate sink locations into resistances of an electrical circuit comprises computing resistances of wiring structures in the sector based on per length unit resistance of the wiring structures;
   wherein said transforming capacitances of the sector with the combination of candidate sink locations into current sources of an electrical circuit comprises transforming capacitances of wiring structures and load capacitances in the sector into the current sources.

3. The method of claim 2, wherein the wiring structures comprise at least one of connecting wires and clock spines.

4. The method of claim 2, wherein the capacitances in the sector comprise wire capacitances and load capacitances.

5. The method of claim 1, wherein said performing the direct current circuit analysis based, at least partly, on the resistances and the current sources comprises:
   determining voltages at nodes in the electrical circuit based on Kirchhoffs Voltage Law;
   determining current flowing between pairs of the nodes in the electrical circuit based on voltages at the nodes and the resistances of wiring structures connecting the nodes;
   determining a variance of voltage at the nodes in the electrical circuit; and
   determining a maximum value of current from currents flowing between pairs of the nodes in the electrical circuit.

6. The method of claim 5, wherein said determining voltages at the nodes in the electrical circuit based on Kirchhoff's Voltage Law comprises computing the voltages using matrix multiplication.

7. The method of claim 5, wherein said determining voltages at the nodes in the electrical circuit based on Kirchhoff's Voltage Law comprises computing the voltages based on a random walk technique.

8. The method of claim 5, wherein the nodes comprise loads of the sector and boundary nodes of the sector.

9. A computer program product for clock network design, the computer program product comprising:
   a computer readable storage medium having computer usable program code embodied therewith, the computer usable program code comprising a computer usable program code configured to:
      determine, within a sector in a clock network design for a microprocessor, combinations of candidate sink locations for sector buffers, wherein the candidate sink locations comprise candidate connection points for connecting output terminals of the sector buffers to wire structures of the sector;
      for each of the combinations of candidate sink locations,
         transform resistances of the sector with the combination of candidate sink locations into resistances of an electrical circuit;
         transform capacitances of the sector with the combination of candidate sink locations into current sources of an electrical circuit;
         perform a direct current circuit analysis based, at least partly, on the resistances and the current sources, wherein results of the direct current circuit analysis include a variance of voltage at nodes of the sector and a maximum value of current from currents flowing between pairs of the nodes of the sector;
      store the results of the direct current circuit analysis for the combinations of candidate sink locations;

determine, with the results of the direct current circuit analysis, which of the combination of candidate sink locations has at least one of the minimum variance of voltage and a minimum of the maximum values of currents; and select, as connection points for the output terminals of the sector buffers, the combination of candidate sink locations that has at least one of the minimum variance of voltage and the minimum of the maximum values of currents.

10. The computer program product of claim 9,
wherein the computer usable program code configured to transform resistances of the sector with the combination of candidate sink locations into resistances of an electrical circuit comprises the computer usable program code configured to compute resistances of wiring structures in the sector based on per length unit resistance of the wiring structures;
wherein the computer usable program code configured to transform capacitances of the sector with the combination of candidate sink locations into current sources of an electrical circuit comprises the computer usable program code configured to transform capacitances of wiring structures and load capacitances in the sector into the current sources.

11. The computer program product of claim 9, wherein the computer usable program code configured to perform the direct current circuit analysis based, at least partly, on the resistances and the current sources comprises the computer usable program code configured to:
determine voltages at nodes in the electrical circuit based on Kirchhoff's Voltage Law;
determine current flowing between pairs of the nodes in the electrical circuit based on voltages at the nodes and the resistances of wiring structures connecting the nodes;
determine a variance of voltage at the nodes in the electrical circuit; and
determine a maximum value of current from currents flowing between pairs of the nodes in the electrical circuit.

12. The computer program product of claim 11, wherein the computer usable program code configured to determine voltages at the nodes in the electrical circuit based on Kirchhoff's Voltage Law comprises the computer usable program code configured to compute the voltages using matrix multiplication.

13. The computer program product of claim 11, wherein the computer usable program code configured to determine voltages at the nodes in the electrical circuit based on Kirchhoff's Voltage Law comprises the computer usable program code configured to compute the voltages based on a random walk technique.

14. The computer program product of claim 11, wherein the nodes comprise loads of the sector and boundary nodes of the sector.

15. An apparatus comprising:
a processor;
a bus; and
a computer readable storage medium having computer usable program code embodied therewith, the computer usable program code comprising a computer usable program code configured to:
determine, within a sector in a clock network design for a microprocessor, combinations of candidate sink locations for sector buffers, wherein the candidate sink locations comprise candidate connection points for connecting output terminals of the sector buffers to wire structures of the sector;

for each of the combinations of candidate sink locations,
transform resistances of the sector with the combination of candidate sink locations into resistances of an electrical circuit;
transform capacitances of the sector with the combination of candidate sink locations into current sources of an electrical circuit;
perform a direct current circuit analysis based, at least partly, on the resistances and the current sources, wherein results of the direct current circuit analysis include a variance of voltage at nodes of the sector and a maximum value of current from currents flowing between pairs of the nodes of the sector;
store the results of the direct current circuit analysis for the combinations of candidate sink locations;
determine, with the results of the direct current circuit analysis, which of the combination of candidate sink locations has at least one of the minimum variance of voltage and a minimum of the maximum values of currents; and
select, as connection points for the output terminals of the sector buffers, the combination of candidate sink locations that has at least one of the minimum variance of voltage and the minimum of the maximum values of currents.

16. The apparatus of claim 15,
wherein the computer usable program code configured to transform resistances of the sector with the combination of candidate sink locations into resistances of an electrical circuit comprises the computer usable program code configured to compute resistances of wiring structures in the sector based on per length unit resistance of the wiring structures;
wherein the computer usable program code configured to transform capacitances of the sector with the combination of candidate sink locations into current sources of an electrical circuit comprises the computer usable program code configured to transform capacitances of wiring structures and load capacitances in the sector into the current sources.

17. The apparatus of claim 15, wherein the computer usable program code configured to perform the direct current circuit analysis based, at least partly, on the resistances and the current sources comprises the computer usable program code configured to:
determine voltages at nodes in the electrical circuit based on Kirchhoff's Voltage Law;
determine current flowing between pairs of the nodes in the electrical circuit based on voltages at the nodes and the resistances of wiring structures connecting the nodes;
determine a variance of voltage at the nodes in the electrical circuit; and
determine a maximum value of current from currents flowing between pairs of the nodes in the electrical circuit.

18. The apparatus of claim 17, wherein the computer usable program code configured to determine voltages at the nodes in the electrical circuit based on Kirchhoff's Voltage Law comprises the computer usable program code configured to compute the voltages using matrix multiplication.

19. The apparatus of claim 17, wherein the computer usable program code configured to determine voltages at the nodes in the electrical circuit based on Kirchhoff's Voltage Law comprises the computer usable program code configured to compute the voltages based on a random walk technique.

20. The apparatus of claim 17, wherein the nodes comprise loads of the sector and boundary nodes of the sector.

* * * * *